US008345724B2

(12) United States Patent
Vethake et al.

(10) Patent No.: US 8,345,724 B2
(45) Date of Patent: Jan. 1, 2013

(54) LASER BEAM INTERLEAVING (75) Inventors: Thilo Vethake, Cranbury, NJ (US);
Ulrich Bonna, Cranbury, NJ (US);
Viorel C. Negoita, Plainsboro, NJ (US)

(73) Assignee: Trumpf Photonics Inc., Cranbury, NJ (US)

( * ) Notice: Subject to any disclaimer, the term of this patent is extended or adjusted under 35 U.S.C. 154(b) by 411 days.

(21) Appl. No.: 12/258,653

(22) Filed: Oct. 27, 2008

(65) Prior Publication Data
US 2010/0103544 A1    Apr. 29, 2010

(51) Int. Cl.
*H01S 3/08* (2006.01)
(52) U.S. Cl. .......................................... 372/99; 359/839
(58) Field of Classification Search ............ 372/69–91, 372/97–103; 359/839, 850, 885; 356/243.5
See application file for complete search history.

(56) References Cited

U.S. PATENT DOCUMENTS

| | | | |
|---|---|---|---|
| 4,826,269 A | 5/1989 | Streifer et al. | |
| 5,513,201 A | 4/1996 | Yamaguchi et al. | |
| 6,005,717 A | 12/1999 | Neuberger et al. | |
| 6,151,168 A | 11/2000 | Goering et al. | |
| 6,229,831 B1 | 5/2001 | Nightingale et al. | |
| 6,259,713 B1 | 7/2001 | Hwu et al. | |
| 6,331,692 B1 | 12/2001 | Krause et al. | |
| 6,516,011 B1 | 2/2003 | Treusch | |
| 6,771,686 B1 | 8/2004 | Ullman et al. | |
| 6,898,222 B2 | 5/2005 | Hennig et al. | |
| 6,975,465 B1 | 12/2005 | Chung et al. | |
| 7,065,105 B2 | 6/2006 | Ehlers et al. | |
| 7,920,616 B2 * | 4/2011 | Brown et al. | 372/55 |
| 2003/0063639 A1 | 4/2003 | Yatskar et al. | |
| 2003/0099267 A1 | 5/2003 | Hennig et al. | |
| 2004/0252743 A1 | 12/2004 | Anikitchev et al. | |
| 2004/0257661 A1 * | 12/2004 | Gao et al. | 359/627 |
| 2006/0018356 A1 | 1/2006 | Voss et al. | |
| 2006/0103939 A1 | 5/2006 | Zheng et al. | |
| 2006/0126690 A1 * | 6/2006 | Kido et al. | 372/43.01 |
| 2006/0139784 A1 * | 6/2006 | Casault | 359/885 |
| 2007/0291813 A1 * | 12/2007 | Hu et al. | 372/107 |
| 2008/0247427 A1 * | 10/2008 | Bloom | 372/21 |
| 2009/0067468 A1 * | 3/2009 | Brown et al. | 372/55 |
| 2009/0190218 A1 * | 7/2009 | Govorkov et al. | 359/495 |
| 2009/0200279 A1 * | 8/2009 | Li | 219/121.66 |

FOREIGN PATENT DOCUMENTS

DE    10061265    6/2002
(Continued)

OTHER PUBLICATIONS

Notification of the Transmittal of the International Search Report and the Written opinion of the International Searching Authority for the corresponding PCT Application No. PCT/US2009/061490, mailed Jan. 4, 2010, 18 pages.

(Continued)

*Primary Examiner* — Jennifer L. Doak
(74) *Attorney, Agent, or Firm* — Fish & Richardson P.C.

(57)    ABSTRACT

A laser system includes a first source and a second source for generating a first laser beam and a second laser beam, respectively, and a mirror arrangement including a first interleaving laser mirror with a high reflecting area configured to reflect the first laser beam and a first high transmitting area configured to transmit the second laser beam.

23 Claims, 8 Drawing Sheets

FOREIGN PATENT DOCUMENTS

| | | |
|---|---|---|
| DE | 10229711 A1 | 1/2004 |
| EP | 0106330 | 4/1984 |
| EP | 0106336 A2 | 4/1984 |
| EP | 0902511 | 3/1999 |
| EP | 1059713 | 12/2000 |
| EP | 1619765 A1 | 1/2006 |
| JP | 2002151799 | 5/2002 |
| JP | 2002335047 | 11/2002 |
| JP | 2003124558 | 4/2003 |
| WO | WO0051211 | 8/2000 |
| WO | 0250599 | 6/2002 |
| WO | 0256074 | 7/2002 |

OTHER PUBLICATIONS

International Preliminary Report on Patentability and Written Opinion from corresponding PCT Application No. PCT/US2009/061490, mailed May 12, 2011, 12 pages.

Notification of the Transmittal of the International Search Report and Written Opinion of the International Searching Authority for PCT Application No. PCT/US2009/061475, mailed Jan. 5, 2010, 20 pages.

* cited by examiner

LASER BEAM INTERLEAVING

TECHNICAL FIELD

This invention relates to a beam forming unit, for example, for a high power diode laser system.

BACKGROUND

Laser systems for a high-performance solid state laser can be based on laser diodes and laser diode bars. To provide a high pump power to, for example, a solid state laser medium of a disk laser, emitted laser beams of multiple laser diodes or laser diode bars are combined to form a pump laser beam.

SUMMARY

The systems disclosed herein provide a simple and cost-effective way of combining high power laser beams, e.g., of diode lasers.

In an aspect of the invention, a laser system includes a first source and a second source for generating a first laser beam and a second laser beam, respectively, and a mirror arrangement including a first interleaving laser mirror with a high reflecting area configured to reflect the first laser beam and a first high transmitting area configured to transmit the second laser beam.

In another aspect, a laser system includes a first source and a second source for generating a first laser beam and a second laser beam, respectively, and a mirror arrangement including a first interleaving laser mirror and a first high transmitting area, wherein the mirror arrangement is configured such that the high reflecting area of the first interleaving laser mirror reflects the first laser beam and that the first high transmitting area of the first interleaving laser mirror transmits the second laser beam.

In another aspect, a laser mirror for interleaving laser light of at least two sources, the laser mirror includes at least two reflecting areas on a first side of the laser mirror for reflecting laser light incident from a first direction to propagate into a second direction; and at least two transmitting areas for transmitting laser light propagating along the second direction towards a second side of the laser mirror, wherein the reflecting areas and the transmitting areas alternate in an interleaving direction.

In another aspect, a method includes providing a first set of laser beams propagating in a first direction towards an interleaving laser mirror, the first set of laser beams being displaced in an interleaving direction, the interleaving direction being orthogonal to the first direction, deflecting the first set of laser beams with the interleaving laser mirror, thereby generating deflected laser beams propagating in a second direction, providing a second set of laser beams propagating in second direction towards the interleaving laser mirror, the second set of laser beams being displaced in the interleaving direction, and transmitting the second set of laser beams through the interleaving laser mirror, thereby generating transmitted laser beams, wherein the deflected laser beams are interleaved with the transmitted laser beams in the interleaving direction.

In another aspect, a method includes, in an interleaving direction, interleaving multiple sets of laser beams each set of laser beams being emitted from a source of a group of sources, thereby generating an interleaved beam, wherein neighboring laser beams within the beam correspond to different sources of the group of sources, and pumping a laser medium with the interleaved beam.

Implementations may include one or more of the following features.

Multiple reflecting and transmitting areas of the laser mirror can alternate in an interleaving direction.

The high transmitting area can be a first high transmitting area and the laser mirror can include a second high transmitting area, wherein the first high transmitting area and the second high transmitting area can be separated by the high reflecting area.

The high reflecting area can be a first high reflecting area and the laser mirror can include a second high reflecting area, wherein the first high reflecting area and the second high reflecting area can be separated by the high transmitting area.

The high transmitting area can be defined by a through hole in the partially transmitting laser mirror or a material/area transmitting the particular wavelength.

The first laser beam and the second laser beam can have an elongated beam profile and the high reflecting area and the high transmitting area can be adapted to the elongated beam profile or other designated beam profiles of the beams.

The mirror arrangement can be configured such that the first and second laser beams can be propagating towards opposite sides of the partially transmitting laser mirror.

The mirror arrangement can be configured to align the first laser beam and the second laser beam in a first direction.

The first source and the second source can include a laser diode or laser diode bar for generating the first laser beam and the second laser beam, respectively.

The first and/or the second source each can include several laser diodes or laser diode bars, which can be displaced with a pitch in a first direction. The pitch can be, for example, at least 5 mm, 10 mm, or 15 mm. In some embodiments, the pitch can be at least as large as a cavity length of a laser diode or laser diode bar. In other embodiments, the pitch can also be smaller than the cavity length of a laser diode or laser diode bar.

The laser minor can be positioned in the mirror arrangement to vertically interleave the several laser beams of the first and second sources.

The laser system can further include a mount and the first and second sources being mounted to the mount with an offset in the first direction.

The laser system can further include a third source for generating a third laser beam and a second interleaving laser mirror with a high reflecting area configured to reflect the first laser beam and the second laser beam and a high transmitting area configured to transmit the third laser beam.

The laser system can further include a forth source for generating a fourth laser beam and a third interleaving laser mirror with a high reflecting area configured to reflect the fourth laser beam and a high transmitting area configured to transmit the first laser beam, the second laser beam, and the third laser beam.

The first and second sources and the mirror arrangement can be arranged to provide essentially the same optical path length for the first and second laser beams.

The interleaving laser mirror can provide a high reflectivity for an incident angle of 45 degrees.

The first source can further include a heat sink and deflecting optics. Moreover, several laser diodes or laser diode bars of the first source can be arranged flat on the heat sink to emit laser beams parallel to the heat sink with a fast axis orthogonal to the stacking direction of the laser beams.

The deflecting optics can be configured to deflect the laser beams being emitted parallel to the heat sink in a direction orthogonal to the heat sink.

The heat sink can be electrically insulated from the laser diodes or laser diode bars via a ceramic layer.

The laser system can further include a beam forming optics positioned in the optical path of the first and second laser beams after the mirror arrangement.

The mirror arrangement can further include two mirrors. The mirror arrangement can include n sources and at least n−1 laser mirrors, with n being an integer number.

The laser system can further include beam forming optics including optics selected from the group consisting of collimating optics for the fast axis, collimating optics for the slow axis, a cylindrical optical telescope for adjusting the fast axis, and a folding mirror.

The laser diodes or laser diode bars can be arranged on the heat sink to enable on operation based on a current flowing serially through the laser diodes or laser diode bars.

The laser system can further include a mount configured to mount the first and second sources.

The transmitting and reflecting areas can be configured to transmit or reflect laser beams with an elongated beam profile.

The interleaving laser mirror can be configured to transmit and/or reflect laser beams with an elongated beam profile that can have at least a ratio of width to height of 2:1, 5:1, 10:1 or more.

The interleaving laser mirror can be a metal mirror. The interleaving laser mirror can include a substrate and a high reflectivity coating on the substrate to form the reflecting areas. At least two transmitting areas can be a through hole through the substrate.

The interleaving laser mirror can include an anti-reflection coating on the substrate to form the transmitting areas.

In the interleaving direction, an extension of one of the at least two transmitting areas can be approximately the same as an extension of one of the at least two reflecting areas. The extension can be, for example, at least 5 mm.

The interleaving laser mirror can have a ladder-like structure, wherein rungs of the ladder-like structure can correspond to the reflection areas and the space between the rungs can correspond to the transmitting areas.

The interleaving laser mirror can provide a high reflectivity for a non orthogonal incident angle, in particular, an incident angle of about 35°, 40°, 45°, 50°, or 55°.

Advantages of some of the embodiments can include a simple mechanical arrangement allowing a mounting of sources that is easy to align and gives direct access to individual sources, thereby improving, for example, the serviceability (e.g., replacement of a source).

Moreover, in some embodiments, laser light from a single source can contribute to various areas in the cross-section of the interleaved beam. Thus, malfunction of a single source affects the beam at those spread out regions only. Accordingly, asymmetric effects to the beam and therefore, e.g. in a laser pump beam application, to the pumped volume of the laser medium can be reduced.

In some embodiments of high power laser systems, sources can provide beams at a larger distance in order to increase the cooling performance for individual diode lasers. Specifically for such systems, the larger "radiation free" areas between (e.g., high power) laser beams can be filled with laser beams of the remaining sources of the system.

The details of one or more embodiments of the invention are set forth in the accompanying drawings and the description below. Other features and advantages of the invention will be apparent from the description and drawings, and from the claims.

DETAILED DESCRIPTION

A group of laser diodes or laser diode bars can be arranged to provide laser beams that are spatially separated. Herein, such an arrangement is referred to as a source of spatially separated (stacked) laser beams. A source of stacked laser beams therefore emits several laser beams that have similar beam parameters, i.e., similar parameters for the slow axis and the fast axis. By combining the laser beams of multiple sources of stacked laser beams, one can form a beam with a radiance that is higher than that for a single source of stacked laser beams, i.e., one can increase the power within a given area of the cross section of the beam. Appropriate beam forming elements can further be applied to shape the beam to allow, for example, efficient optical pumping of a laser medium.

Figure 1:
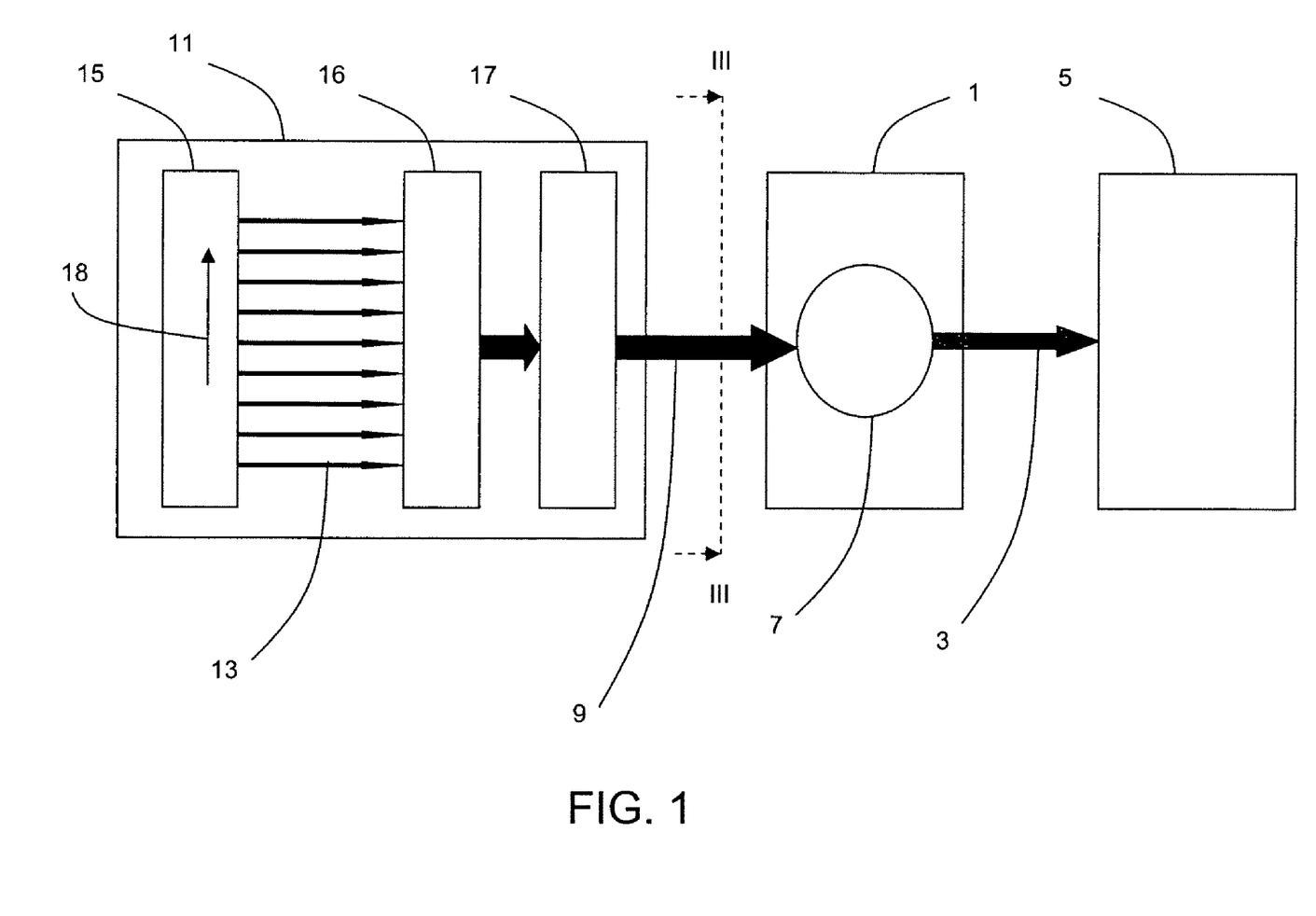
FIG. 1 is a schematic block diagram of an optically pumped laser system using an interleaved beam.

FIG. 1, an optically pumped laser system 1 provides a high power laser beam 3 to a laser processing system 5 such as a laser cutting system or a laser welding system. For example, the laser system 1 can be a solid state laser system, such as a disk laser system, that provides a several kW laser beam to the laser processing system 5. A further exemplary laser system can be a fiber laser. To generate the laser beam 3, a laser medium 7 of the laser system 1 is optically pumped with an interleaved beam 9 that is generated by a laser system 11. However, the laser system 11 could also be configured as an independent laser system that is used for laser applications, such as surface treatment, hardening, material processing, and soldering.

The laser system 11 includes, for example, a plurality of sources mounted in an arrangement 15, a mirror arrangement 16, and beam forming optics 17. The arrangement 15 is configured to provide a laser beam grouping 13 of a plurality of laser beams, with each laser beam being displaced along one dimension that can be referred to as the interleaving direction 18. The mirror arrangement 16 includes several interleaving laser mirrors that allow overlaying the laser beams of the grouping 13 on top of each other, thereby forming the interleaved beam 9. The beam forming optics 17 can include optics to collimate and homogenize the laser beams within the interleaved beam 9. The interleaved beam 9 is provided as a pump laser beam to the laser system 1, for example, directly or through a waveguide such as an optical fiber.

Figure 2:
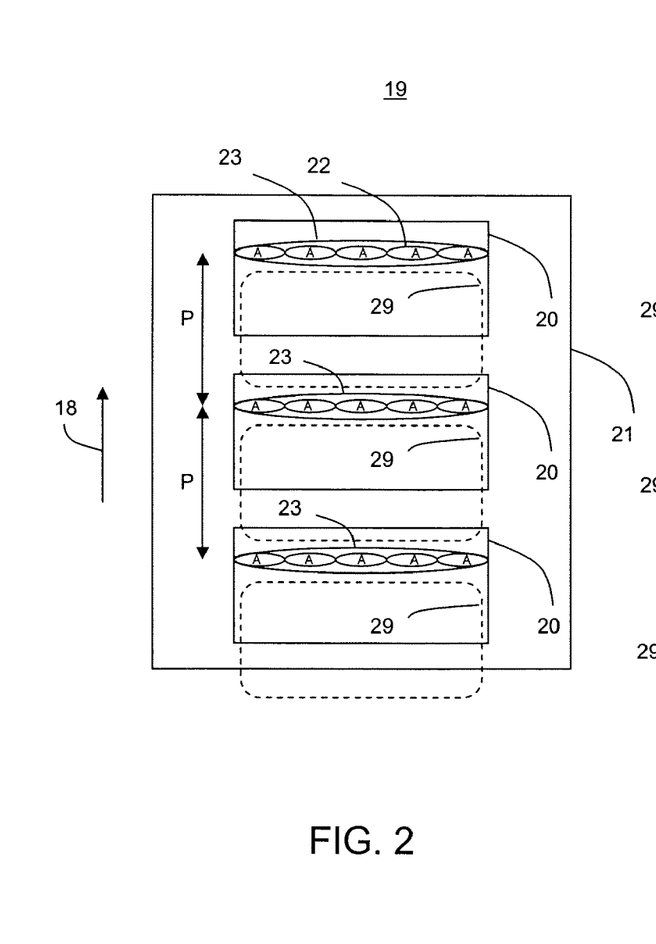
FIG. 2 is a schematic front view of a source.
Figure 3:
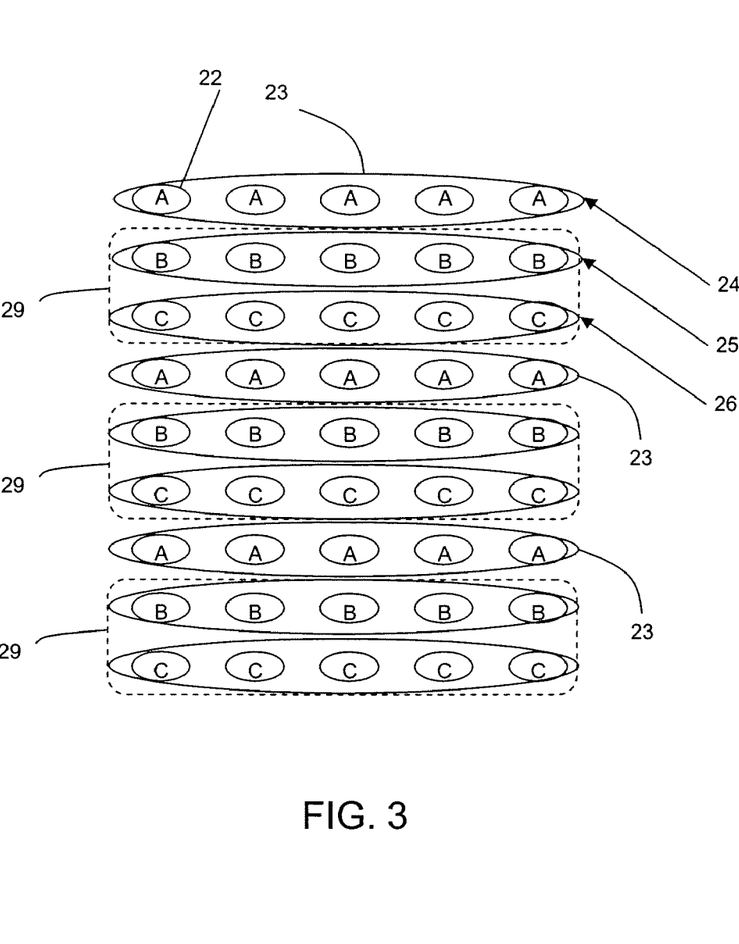
FIG. 3 is a cross-sectional view of an interleaved beam shown in FIG. 1 taken along cross-section III-III generated with three sources as shown in FIG. 2.
Figure 4:
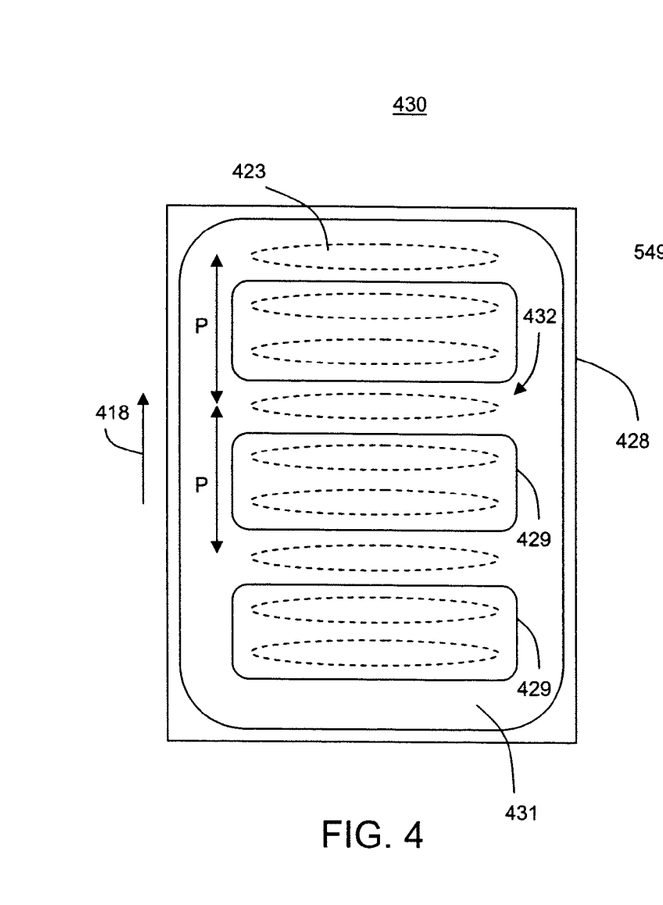
FIG. 4 is a schematic front view of a laser mirror.

FIG. 2 shows schematically a source 19 that can be used in the arrangement 15. FIG. 3 illustrates a cross-section taken along view III-III of the interleaved beam 9 of FIG. 1; this cross-section could be created with three of the sources 19 of FIG. 2. FIG. 4 shows schematically a laser mirror that can be used in the mirror arrangement 16. An embodiment of an interleaving laser system is described in detail in connection with FIGS. 5-13 that can be used, for example, as the laser system 11 in FIG. 1.

As shown in FIG. 2, the exemplary source 19 includes three laser diode bars 20 that are mounted on a common heat sink 21. Each laser diode bar 20 includes a semiconductor structure with five neighboring emitting regions. The laser light of a single emitting region has an elliptical beam profile 22. The elliptic shape of the beam profiles 22 indicates the different optical properties of a fast axis and a slow axis of a laser beam. For example, the laser light of an emitting region diverges more in the direction of the fast axis due to the thinness of the emitting region than in direction of the slow axis.

The light of the five emitting regions forms a laser beam 23 of the laser beam grouping 13 and each laser beam 23 has an elongated shape. In some embodiments, the emitting regions emit light orthogonal to the heat sink 21, while in other embodiments the light is emitted parallel to the heat sink 21 and then deflected by, e.g., 90°.

In the interleaving direction 18, the three laser diode bars 20 are displaced from each other by a pitch P and therefore the three laser beams 23 are also displaced by the pitch P. Thus, the laser beams 23 emitted from a single source 19 form a beam having its own cross-section, the cross-section includes regions with laser light displaced by the pitch P and regions 29 without laser light in between the regions with laser light. Some high power sources provide laser beams at a large pitch of several millimeters, e.g., of at least 5 mm, 10 mm, or 15 mm. Examples of such high power sources include a source with flat mounted laser diode bars (flat source) as described in connection with FIGS. 11-13 and an arrangement with stacked laser diode bars (group source) as described in connection with FIG. 14.

Interleaving laser systems can be specifically suited for the use of sources having a large pitch.

FIG. 3 shows a simplified cross-section along the view III-III of the interleaved beam 9 in FIG. 1 based on three sources 19 with each source 19 having three laser diode bars 20 and with each laser diode bar 20 producing five laser beams 22 (as shown in FIG. 2). The laser system 11 interleaves the three laser beams 23 from each of the three laser diode bars 20 (for a total of nine laser beams in the grouping 13) such that within the cross-section of the interleaved beam 9, light of neighboring rows of the beam originate from different sources 19. Within the cross-section, a single laser diode bar 20 contributes to a row 24 in the cross-section indicated through the elliptical beam profiles 22 associated to the five emitting regions of the laser diode bars 20.

In the example of FIG. 3, three rows of laser beams originate from each of the three sources 19. For example, the rows 24 relate to laser radiation A of a first source, the rows 25 to laser radiation B of a second source, and the rows 26 to laser radiation C of a third source. Accordingly, the radiation-free areas 29 in between the emitted light of laser diode bars 20 of each of the sources 19 can be at least partially filled with laser radiation originating from the two remaining sources 19 of the arrangement 15. Thus, the laser radiation of a source 19 does not contribute to a single area of the cross-section of the interleaved beam 9 but is contributes to different regions within the entire cross-section of the interleaved beam 9. Such a spreading of contributions to the cross-section from each of the sources 19 is increased when sources with a larger number of laser diode bars are interleaved with each other.

FIG. 4 illustrates a laser mirror 430 that is partially reflecting and partially transmitting and, for example, can be used to interleave laser beams from three sources as shown in FIG. 2. The laser mirror 430 includes a rectangular substrate 428. When mounted in the mirror arrangement 16, the long side of the laser mirror 430 extends in the interleaving direction 18.

The laser mirror 430 is configured to interact with a series of laser beams, which are indicated by the slashed beam profiles 423. The series of laser beams 423 includes three laser beams that originate from each source and that are separated by the pitch P. The laser mirror 430 includes three transmitting regions 429 in the form of through holes each of which are shaped to transmit two neighboring laser beams 423. The transmitting regions 429 are in general at least partially transmitting. One side of the substrate 428 is coated with a high reflectivity coating 431, thereby providing reflecting regions 432 in between (and eventually above and/or below) the through holes. The reflecting regions have the size to reflect two neighboring laser beams 423. In other words, the laser mirror 430 has a ladder-like structure, where rungs of the ladder-like structure correspond to the reflection regions 432 and the space between the rungs corresponds to the transmitting regions 429. The configuration and geometry of the laser mirror 430 is suitable for an arrangement 15 having three sources 19; however, other configurations and geometries are possible, and would depend on the number of sources 19 of the arrangement 15 and the relative size and position of the sources 19.

Thus, depending on the relative position between the laser mirror 430 and the source in the interleaving direction, the laser beams 423 of that source are either transmitted or reflected. Thus, when the mirror arrangement 16 is configured such that laser beams from a first source and laser beams from a second source are propagating towards opposite sides of the laser mirror 430 and one can choose incident angles such that the reflected laser beams and the transmitted laser beams alternate along the interleaving direction 18.

In the mirror arrangement 16, n−1 laser mirrors 430 can be arranged to interleave laser beams of n sources, with n being an integer number. The transmitting and reflecting regions 429, 432 can be of the size to transmit or reflect laser beams with an elongated beam profile that has at least a ratio of width to height of for example, 2:1, 5:1, 10:1 or more.

In FIGS. 5-13, an exemplary interleaving laser system 511 is described to illustrate geometrical interleaving of laser beams 523 of six sources 519. In the embodiment, each of the sources 519 includes twelve laser diode bars emitting laser beams 523 that are spatially displaced by a pitch of ten millimeters. However, similar interleaving can also be performed for more or less sources having a smaller or larger pitch.

Figure 5:
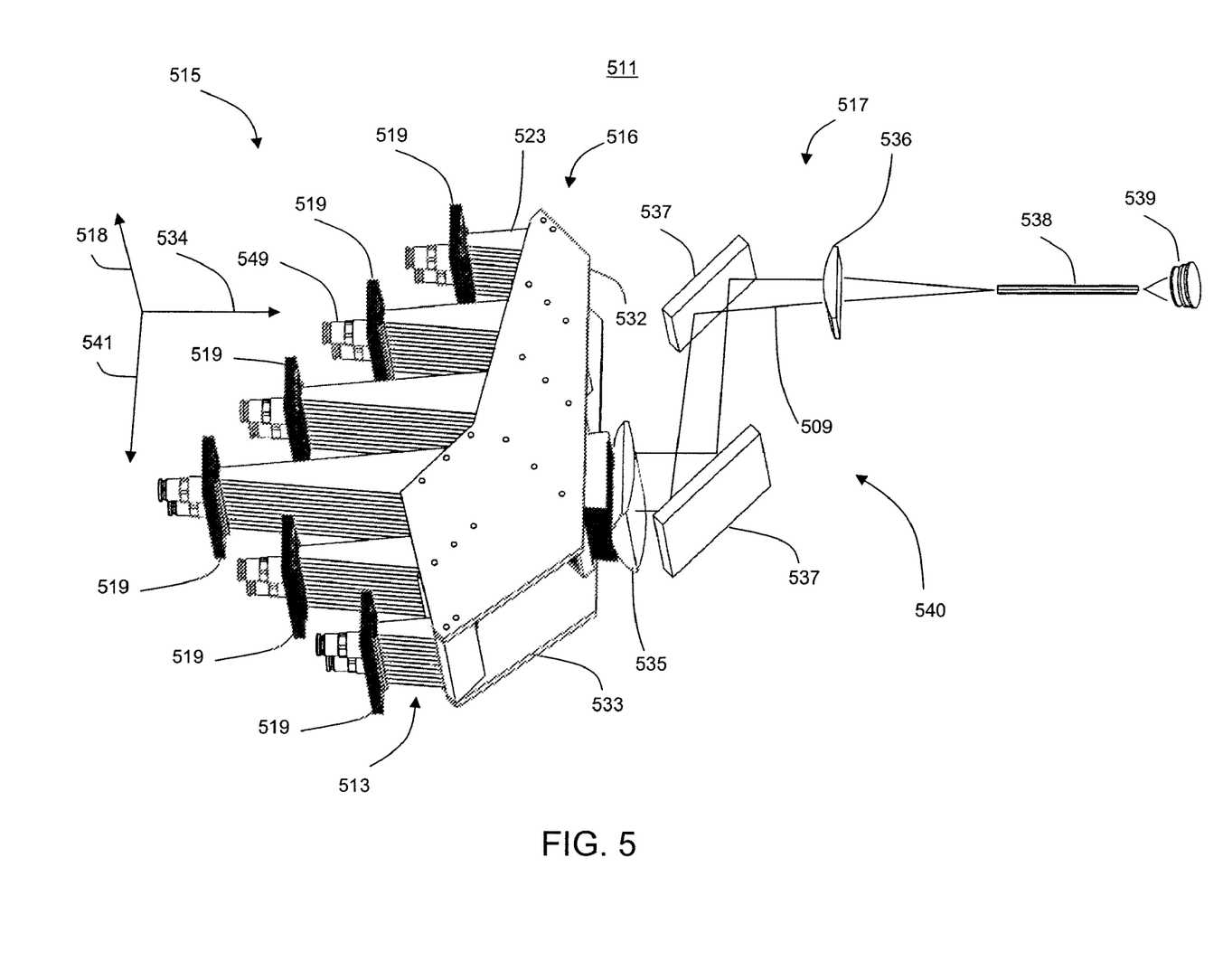
FIG. 5 is a perspective view of an implementation of a laser system that can be used in the laser system of FIG. 1.
Figure 6:
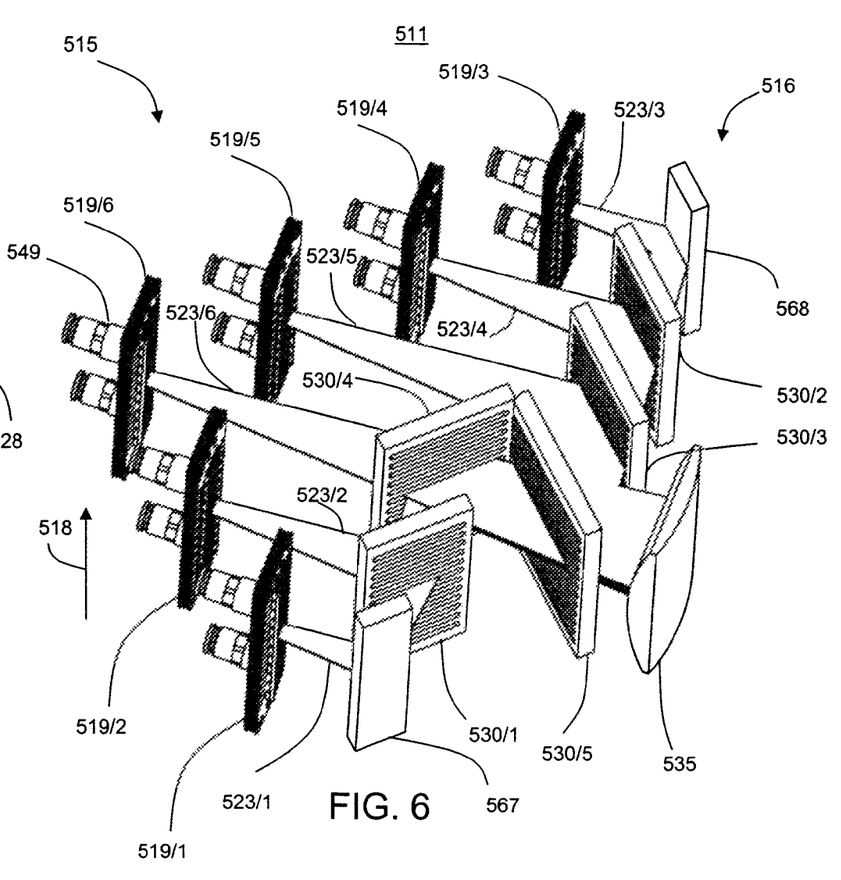
FIG. 6 is a top view of the source and mirror arrangement of FIG. 5 with removed top plate and bottom plate of the mirror arrangement.

Specifically, in FIGS. 5 and 6 the laser system 511 includes an arrangement 515 of six sources 519 and a mirror arrangement 516 including five interleaving laser mirrors 530/1-530/5 and two bending mirrors 567 and 568 being mounted between a top plate 532 and a bottom plate 533. The sources 519 are arranged side by side and are configured to emit laser beams 423 in a first direction 534.

The laser system 511 includes the mirror arrangement 516 to form the beam 509 from laser beams 523, which are displaced in the interleaving direction 518. At the exit of the mirror arrangement 516, the laser beams 523 are interleaved in the interleaving direction 518. Thus, the mirror arrangement 516 redirects the incoming laser beams 523 in a common direction towards a first cylindrical lens 535 of the beam forming optics 517.

In the embodiment of FIG. 5, the beam forming optics 517 includes a second cylindrical lens 536, folding mirrors 537, a beam mixer 538, and collimating optics 539. The first and second cylindrical lenses 535 and 536 form a telescope 540 to adjust the beam parameters of the fast and slow axes of the laser beams 523. Thus, the beam forming optics 517 adjusts the various optical parameters of the interleaved beam 509.

To provide identical optical path lengths for the laser beams 523 of the various sources 519, the mirror arrangement 516 is based on interleaving laser mirrors 530 optimized for reflecting under 45° and the sources 519 are positioned at identical distances in the first direction 534 and in a second direction 541 (the second direction 541 being orthogonal to the first direction 534 and the interleaving direction 518).

Additionally, as described below in connection with FIG. 10, the six sources 519 are identical and are mounted at differing positions in the interleaving direction, such that each laser beam 523 is emitted at its own specific "interleaving" coordinate. Therefore, each of the laser beams 523 propagates parallel to the first direction 534 and the laser beams 523 are then transmitted or reflected by the interleaving laser mirror s as described in connection with FIG. 6-9.

Figure 7:
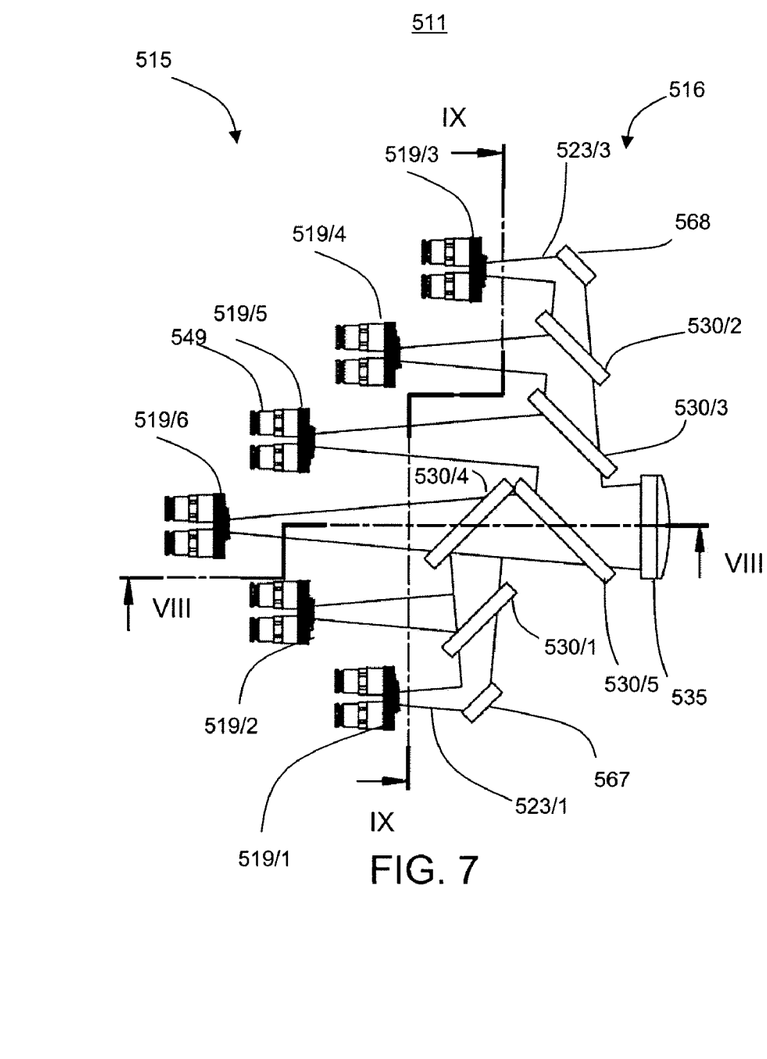
FIG. 7 is a top view of the laser system of FIG. 6.

Moreover, FIG. 5 shows coolant connections 549 for cooling the sources 519. The views of the interleaving laser system 511 shown in FIGS. 6 and 7 illustrate the mirror arrangement 516 with its top and bottom parts 532 and 533 removed. As discussed above, the arrangement 515 and the mirror arrangement 516 provide similar optical propagation for the laser beams 523/1-523/6. For example, the optical path lengths of each of the laser beams 523 to the cylindrical lens 35 can be considered identical. Then, the laser beams 523 experience approximately the same divergence within the interleaving laser system 511. The arrangement 515 is configured for identical sources 519 with, e.g., a pre-aligned emission angle of 90° with respect to a front side of the sources 519. Each source 519 is mounted to a housing of the interleaving laser system 511 (not shown).

The housing includes alignment pins for mounting the sources 519 in reproducible position. Thus, one can replace a source 519 without realigning the mirror arrangement 516.

FIGS. 6 and 7 show the positions of the interleaving mirrors 530/1-5 and the 90° bending mirrors 567 and 568 within the mirror arrangement 516, positioned with a 45° angle of incidence that bends the laser beams by 90°. The width of the interleaving mirrors 530/1-5 is adapted to the width of the diverging laser beams 523, e.g., the interleaving mirrors 530/1-5 increase in width the closer they are positioned to the lens 535. Each of the interleaving mirrors 530/1-5 includes as many reflective regions and as many transmitting regions as each of the sources 519 emits laser beams 523. Thus, for example, if each source emits twelve laser beams 523, then the interleaving mirror 530 has at least twelve reflective regions and twelve transmitting regions. The reflective regions and the transmitting regions interleave in the interleaving direction 518.

In the mirror arrangement 516, the interleaving mirror 530/1 is positioned such that the laser beams 523/1 emitted from the source 519/1 and reflected by the 90° bending mirrors 567, are transmitted through the interleaving mirror 530/1 while the laser beams 523/2 emitted from the source 519/2 are reflected by the interleaving mirrors 530/1. Similarly, the interleaving mirror 530/2 is positioned such that the laser beams 523/3 emitted from the source 519/3 are transmitted through the interleaving mirror 530/2 while the laser beams 523/4 emitted from the source 519/4 are reflected by the interleaving mirror 530/2.

Furthermore, the interleaving mirror 530/3 is positioned such that after interleaving mirror 530/2, the laser beams 523/3 and 523/4 are transmitted through the interleaving mirror 530/3 while laser beams 523/5 emitted from the source 519/5 are reflected by the interleaving mirror 530/3. Similarly, the interleaving mirror 530/4 is positioned such that after the interleaving mirror 530/1, the laser beams 523/1 and 523/2 are reflected by the interleaving mirror 530/4 while the laser beams 523/6 emitted from the source 519/6 are transmitted through the interleaving mirror 530/4.

Finally, the interleaving mirror 530/5 is positioned such that the laser beams 523/3, 523/4, and 523/6 are transmitted while the laser beams 523/1, 523/2, and 523/5 are reflected by the interleaving mirror 530/5.

The diverging laser beams 523 and, e.g., in width adapted interleaving mirrors 530/1-5 is shown in the top view of FIG. 7. FIG. 7 indicates further the viewpoints of FIGS. 8 and 9.

Figure 8:
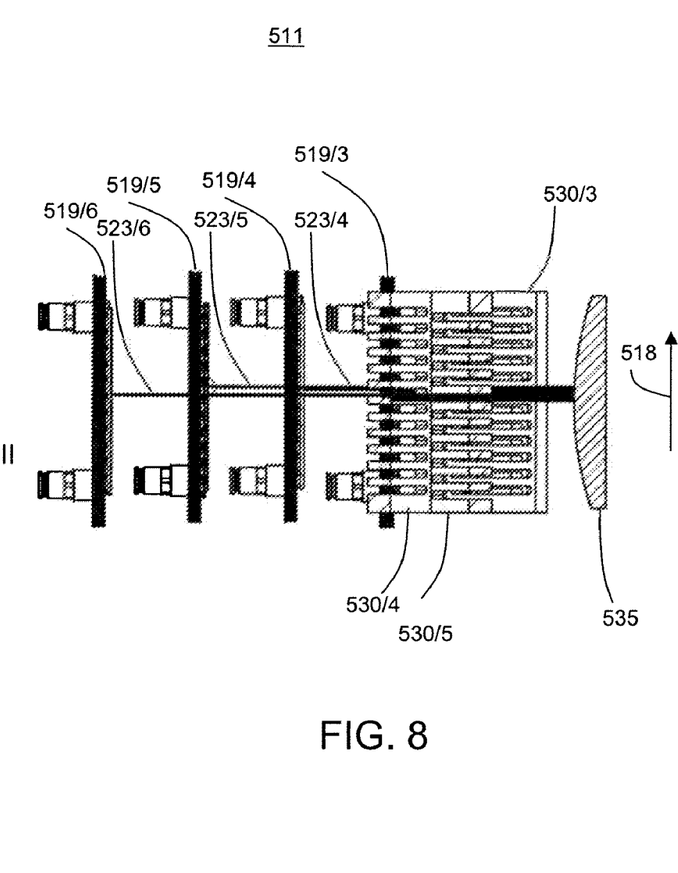
FIG. 8 is a side view of the laser system of FIG. 6 along cross-section VIII-VIII as shown in FIG. 7.

FIG. 8 shows a cross-section along the direction VIII-VIII as shown in FIG. 7. The varying positions of the sources 519/4, 519/5, and 519/6 in the interleaving direction 518 provide the laser beams 523/4, 523/5, and 523/6 to the mirror arrangement 516 that each have different positions in the interleaving direction 518. Appropriately setting the position of the reflecting and transmitting regions of the interleaving laser mirrors 530/3-5 permits alignment of the laser beams 523/4-6 while alternating in the interleaving direction 518.

Figures 9, 10:
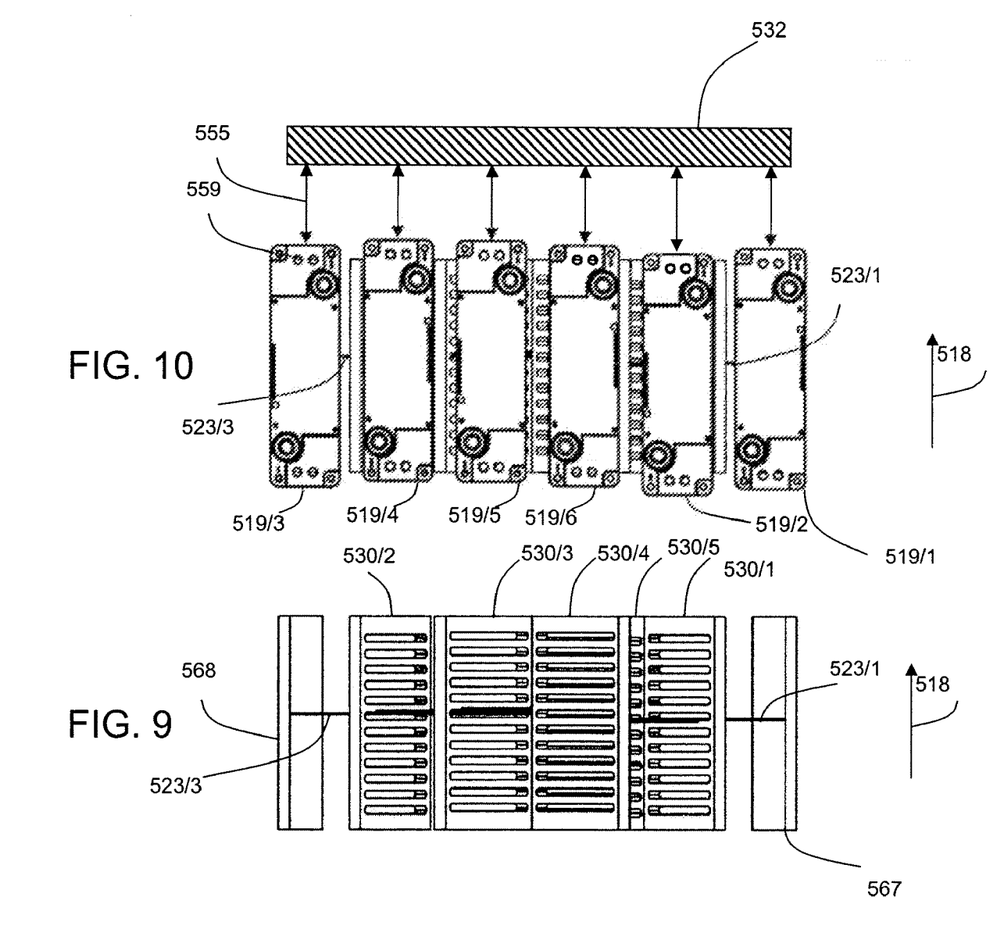
FIG. 9 is a side view of the laser system of FIG. 6 along cross-section IX-IX as shown in FIG. 7.
FIG. 10 is a side view of the laser system of FIG. 6.

FIG. 9 shows a cross-section of the interleaving laser system 511 along the direction IX-IX as shown in FIG. 7. Between the 45°-mirrors 567 and 568, the interleaving mirrors 530/1-5 provide reflecting and transmitting regions at various heights, thereby enabling the interleaving beam 509 to have a beam profile with twelve sets of alternating laser beams 523/16 (similar to the one shown and explained in connection with FIG. 3).

As shown in FIG. 10, each of the six identical sources 519/1-6 is attached relative to the top part 532 of the housing at a position 555 in the interleaving direction. The position can be defined, for example, by alignment pins at side walls of the housing, and the alignment pins are adapted to fit into alignment holes 559 of the sources 519/1-6. Accordingly, the laser beams 523 are emitted at different positions in the interleaving direction between the housing top 532 and the housing bottom 533. The laser beams 523—each propagating at its own position in the interleaving direction—interleave after the last interleaving mirror 530/5 by which the laser beams 519/35 are reflected and through which the laser beams 523/1, 523/2, and 523/6 are transmitted. Thus, in the interleaving laser system 511, the individual laser beams 523 of all sources are guided one on top of the other, such that the radiation-free space of each of the sources is at least partially filled with the laser beams of the remaining sources 519.

For high power applications, high power sources such as described in connection with FIGS. 11-14 can be used in the arrangement 515.

Figure 11:
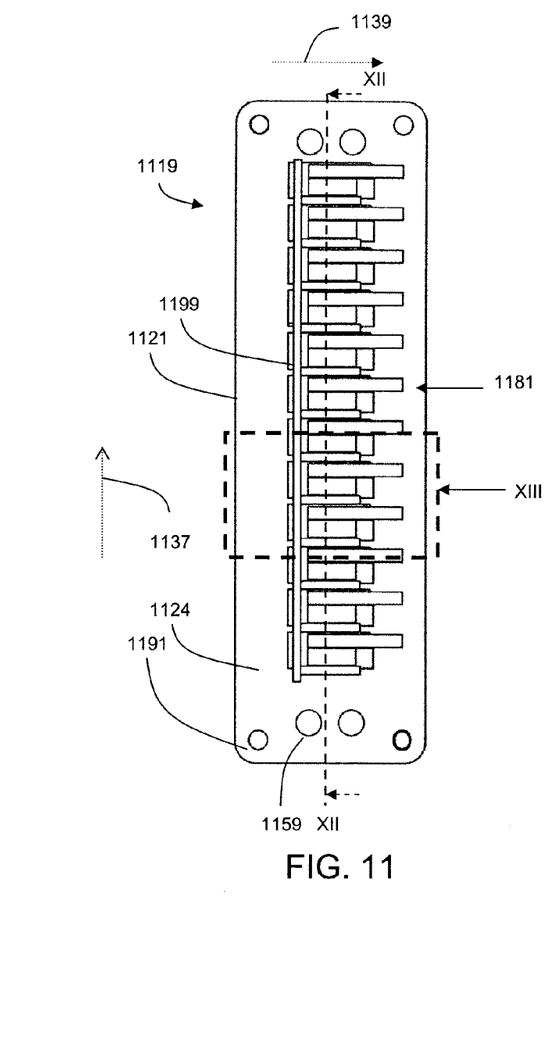
FIG. 11 is a side view of a first exemplary source of the laser system of FIG. 6.
Figure 12:
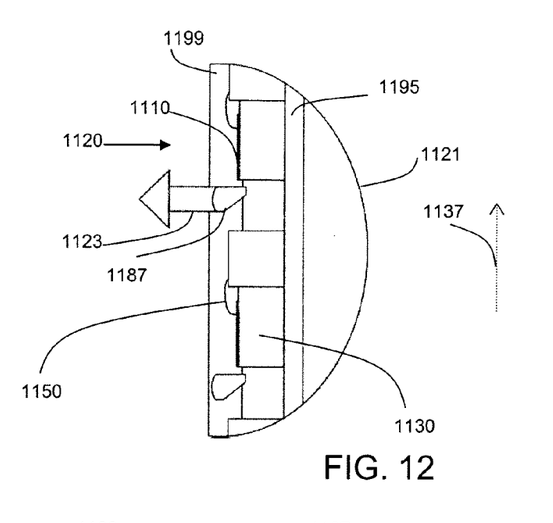
FIG. 12 is an enlarged cross-section of the source along cross-section XII-XII as shown in FIG. 11.
Figure 13:
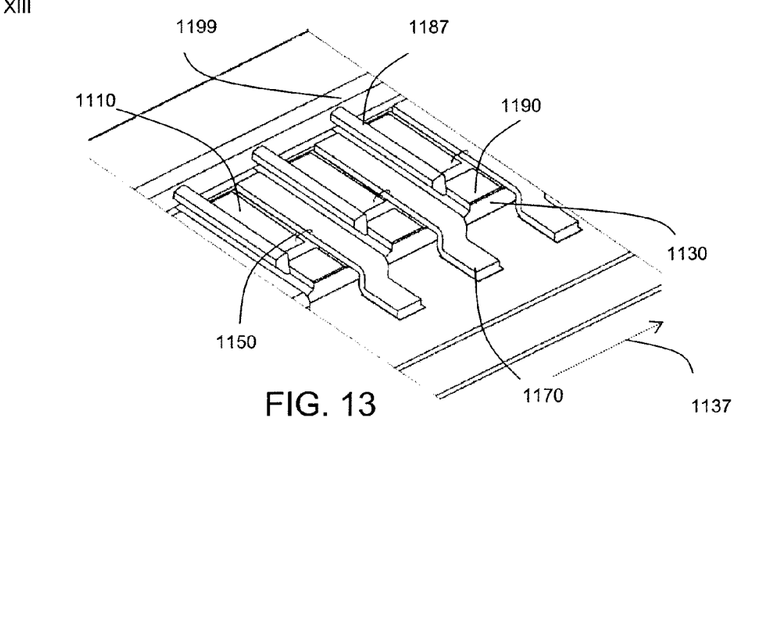
FIG. 13 is an enlarged perspective view of a section XIII as shown in FIG. 11 of the source of FIG. 11.

As shown in FIGS. 11-13, a flat source 1119 includes twelve laser diode bar units 1181, and each laser diode bar unit 1181 includes a laser diode bar 1120, a prism lens 1187, and electrical connections 1150.

The diode laser bars 1120 are arranged with a flat side on a single piece rectangular heat sink 1121. Therefore, the source 1119 can be referred to as a flat source, in which each laser diode bar 1120 can be efficiently cooled through the large area being in thermal contact with the heat sink 1121. Generated heat is removed from the sources by a coolant being pumped through the heat sink 1121 through the coolant connections at the backside as shown, e.g., in FIG. 5. Mount holes 1191 are located at each corner and alignment holes 1159 are located at the short sides of the rectangular heat sink 1121.

The twelve laser diode bars 1120 are arranged along a direction 1137 of the length of the rectangular heat sink 1121, which in FIG. 5 is arranged along the axial direction 537. The heat sink 1121 has an insulating ceramic layer 1195 as a top layer to electrically insulate the laser diode bars 1120 from the heat sink 1121. Each of the laser diode bars 1120 includes a semiconductor structure 1110 with an active region having multiple emitting regions. The semiconductor structure 1110 is attached to a p-contact 1130. Electrical connection 1150, e.g. wire bond, electrically connects the semiconductor structure 1110 with an n-contact 1170 and the n-contact 1170 is electrically connected to the p-contact of a neighboring diode laser unit. Thus, when operating the source 1119, the (identical) current flows serially through all laser diode bars 1120. Additionally, each of the diode laser bars 1120 can be controlled with a chip element 1190.

Each of the semiconductor structures 1110 has an elongated emitting surface 1112, e.g., 30-45 neighboring active regions that are evenly distributed on a length of about 10 mm. Each emitting surface 1112 is perpendicularly oriented to the heat sink 1121 and has an emission direction along the direction 1137. Thus, the laser diode bars 1120 emit laser beams 1123 essentially in the same plane, which is parallel to the planar surface 1124 of the heat sink 1121. Each laser beam 1123 has an elongated beam profile, with its slow axis oriented in direction of the elongation of the emitting surface 1112 of the laser diode bar 1120, i.e., in a direction 1139 of a width of the heat sink 1121 (as discussed above with respect to FIGS. 2 and 3), and initially a fast axis oriented in a direction perpendicular to the planar surface 1124 of the heat sink 1121.

The emitted laser beam 1123 is internally reflected by the prism lens 1187 and the beam exiting the prism lens 1187 propagates away from the heat sink 1121 along a direction that is orthogonal to the surface 1124 of the heat sink 1121. Thus, after exiting the prism lens 1187, the fast axis of the laser beam 1123 is in the direction 1137 along the length of the heat sink 1121, while the slow axis of the laser diode bar 1120 is not changed and remains along the direction 1139. Additionally, the prism lens 1187 collimates the laser beam 1123 that is strongly divergent in the direction of the fast axis. The orientations of the prism lenses 1187 are secured by a common glass mount 1199.

The flat source 1119 can have the following parameters. Each source 1119 can provide an output power of about 1700 W based on twelve laser diode bars 1120. The width of a laser diode bar 1120 in the slow axis direction can be about 10 mm. The full-angle divergence of the laser beam 1123 in the slow axis direction can be approximately 6°-10°. The emission in the fast axis direction from the individual laser diode bars 1120 is achieved through an emission surface 1112 having a height of approximately 1 μm. Initially, the laser beams 1123 have a full-angle divergence of approximately 40°-70°. Each of the laser beams 1123 emitted from each laser diode bar 1120 is collimated in the fast axis direction using the prism lens 1187. The collimated laser beams 1123 typically extend 0.6-1.2 mm in the fast axis direction. The full-angle divergence of the collimated beams after passing through the prism lens is approximately 0.5°-2° in the fast axis direction. The quality of the prism lens 1187, the accuracy of the lens' alignment, and the straightness of the laser diode bar 1120 determine the divergence angles.

Applying the flat sources 1119 in the embodiment of the arrangement 15 of FIGS. 5-10, the fast axes of the emitted laser beams 1123 are oriented initially, i.e., when leaving the semiconductor structures, in the direction orthogonal to the flat source 1119. After the reflection within the prism lenses 1187, the fast axis of the emitted laser beams 1123 are directed in the interleaving direction 518.

Referring again to the flat source 1119 of FIGS. 11-13, the pitch between two emitted laser beams 1123 is about ten times larger then the size of the laser beam 1123 when leaving the prism lens 1187. Thus, about 9/10 of the cross-section of a beam of a flat source is free from any laser radiation. With, e.g., the mirror arrangement 516, the radiation free part of the cross-section can be filled with laser beams 1123 from other flat source 1119.

Figure 14:
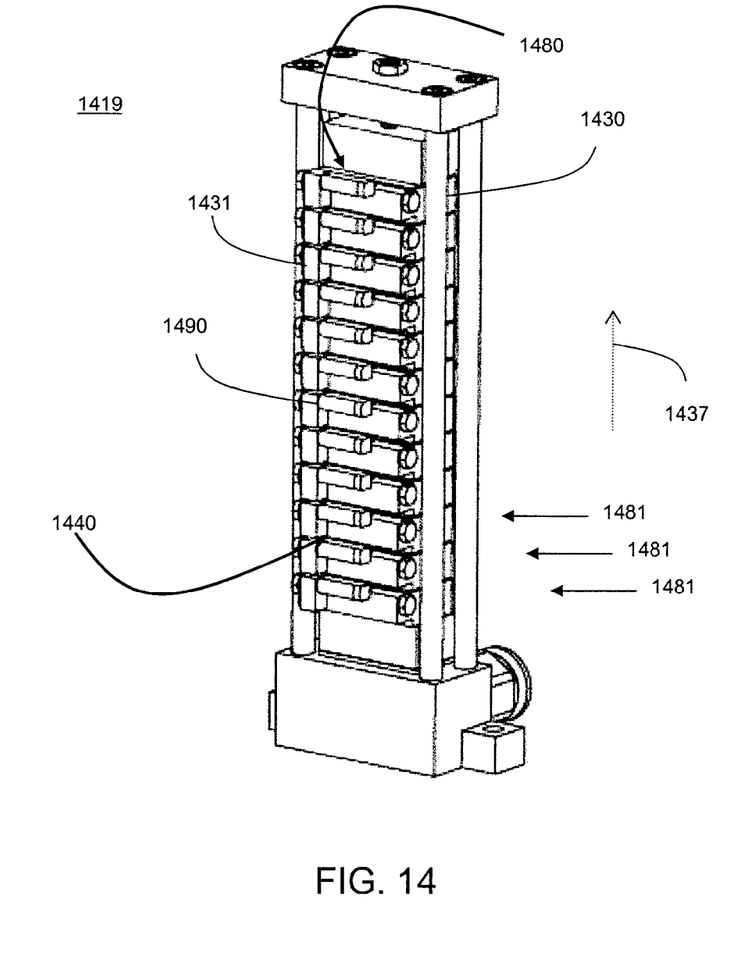
FIG. 14 is a perspective view of a second exemplary source that can be used in connection with the laser system shown in FIGS. 5-10.

An alternative high power source is shown in FIG. 14 in form of a group source 1419, in which multiple laser diode bar units 1481 are grouped together. In FIG. 14, for example, the group source 1419 includes twelve laser diode bar units 1481, which each include a laser diode bar 1420, a lens 1490, and electrical connections. Each of the diode laser bars 1420 is arranged on a surface of a copper block 1430 and emits laser beams though a lens 1490 at a front side 1440 of the group source 1419. In a region behind the laser diode bars 1420, the neighboring copper blocks 1430 are hold in tight contact such that the copper bocks 1430 can be cooled with a common coolant system.

The twelve laser diode bars 1420 are arranged along a direction 1437 of the length of the group source 1419. Each of the laser diode bars 1420 includes a semiconductor structure with an active region having multiple emitting regions that form an elongated emitting surface. Each emitting surface is parallel to the front side 1440 of the group source 1419 and has an emission direction perpendicular to the front side 1440. Each laser beam has an elongated beam profile, with its slow axis oriented in direction of the elongation of the emitting surface of the laser diode bar 1420, and a fast axis in the direction 1437.

Lenses 1490 collimate the laser beam that is strongly divergent in the direction of the fast axis. The orientations of the lenses 1490 are secured by an extension 1431 of the copper block 1430 or by a glass block that is attached to the copper block 1430.

The group source 1419 can have beam parameters similar to the flat source 919.

As for the flat source 1119 of FIGS. 11-13, the pitch for the group source 1419 between two emitted laser beams can be, for example, about ten times larger then the size of the laser beam when leaving the lens 1490. Thus, about 9/10 of the cross-section of a beam of a group source 1419 is free from any laser radiation. Using the arrangement 15 and the beam forming optics 17, the laser radiation free part can be filled with laser beams from other group sources 1419.

In the described arrangement 515, the source 1119 can further be geometrically well aligned, as the contacting surface or contact points between the associated mount and the heat sink 1121 can extend over the complete length of the source 1119 thereby providing a high angular precision of the alignment of the fast axis.

Various configurations can use the described concept with a larger or smaller number of sources and interleaving laser mirrors. The interleaving laser mirrors 530 can have reflective coatings that are adapted to the specific incidence angles of the laser beams 523. Alternatively, some or all of the involved mirrors can be metal mirrors (e.g. with a silver coating). The reflective coatings can be applied to transmitting or non-transmitting substrates made of, e.g., glass or quartz-substrates. For transmitting substrates, an alternative embodiment to the above described through hole embodiments includes transmitting regions that are not coated or that are coated with an antireflection coating.

In some embodiments, the reflectivity and transmission of light is at least 80%, 85%, 90%, 95%, 98%, 99%, or 99.8%. The mirror arrangement can alternatively or in addition to the incident angles of 45° include interleaving laser mirrors designed for other incident angles that include, for example, 35°, 40°, 50°, or 55°.

Additionally or alternatively, the laser system 11 can include folding mirrors to provide a more compact telescope and/or collimating optical system within the beam forming optics 17. For example, cylindrical mirrors can be used as folding mirrors. Additionally, or alternatively, in the beam forming optics 17, the collimation of the slow axis and/or the fast axis can include one or more of a cylindrical lens, a flat mirror, a parabolic mirror, a parabolic folding mirror, and a lens having a concave parabolic shaped surface.

As shown in FIG. 1, in the optical beam path before an optical fiber or the laser medium, additional optical components can be used to adapt and improve various beam parameters such as, for example, beam divergence, smoothness of the beam profile.

Accordingly, other embodiments are within the scope of the following claims.

What is claimed is:

1. A laser system comprising:
a first source and a second source for generating, along a first direction, a first laser beam and a second laser beam, respectively, wherein the first source and second source are offset from one another in the first direction; and
a mirror arrangement including a first interleaving laser mirror with a high reflecting area configured to reflect the first laser beam and a first high transmitting area configured to transmit the second laser beam; and
a mount, wherein the first and second source are mounted to the mount with a second offset in an interleaving direction orthogonal to the first direction and a third offset from one another in a lateral direction that is orthogonal to both the first direction and the interleaving direction, such that the first source and second source are positioned to emit the first laser beam and the second laser beam at different positions along the interleaving direction, and
wherein the first and a second sources each include several laser diodes, which are displaced from one another along the interleaving direction, the laser diodes of the first source being arranged on a first heat sink, and the laser diodes of the second source being arranged on a second different heat sink.

2. The laser system of claim 1 wherein multiple reflecting and transmitting areas of the first interleaving laser mirror alternate in the interleaving direction.

3. The laser system of claim 1 wherein the high transmitting area is a first high transmitting area and the first interleaving laser mirror includes a second high transmitting area, wherein the first high transmitting area and the second high transmitting area are separated by the high reflecting area.

4. The laser system of claim 1 wherein the high reflecting area is a first high reflecting area and the first interleaving laser mirror includes a second high reflecting area, wherein the first high reflecting area and the second high reflecting area are separated by the high transmitting area.

5. The laser system of claim 1 wherein the mirror arrangement is configured such that the first and second laser beams are propagating towards opposite sides of the first interleaving laser mirror.

6. The laser system of claim 1 wherein the mirror arrangement is configured to align the first laser beam and the second laser beam in the first direction.

7. The laser system of claim 1 wherein the first source and the second source include at least one laser diode bar for generating the first laser beam and the second laser beam, respectively.

8. The laser system of claim 1 further comprising a third source for generating a third laser beam and a second interleaving laser mirror with a high reflecting area configured to reflect the first laser beam and the second laser beam and a high transmitting area configured to transmit the third laser beam.

9. The laser system of claim 1 wherein the first and second sources and the mirror arrangement are arranged to provide essentially the same optical path length for the first and second laser beams.

10. The laser system of claim 1 further comprising a beam forming optics positioned in the optical path of the first and second laser beams after the mirror arrangement.

11. The laser system of claim 1 wherein the mirror arrangement includes n sources and at least n−1 interleaving laser mirrors, with n being an integer number greater than 1.

12. The pump laser system of claim 1 further comprising beam forming optics including optics selected from the group consisting of collimating optics for the fast axis, collimating optics for the slow axis, a cylindrical optical telescope for adjusting the fast axis, and a folding mirror.

13. A system comprising:
a plurality of sources, each source for generating, along a first direction, a corresponding laser beam;
a laser mirror for interleaving laser light of the plurality of sources, the laser mirror comprising:
at least two reflecting areas on a first side of the laser mirror for reflecting laser light incident from the first direction to propagate into a second direction; and
at least two transmitting areas for transmitting laser light propagating along the second direction towards a second side of the laser mirror, wherein the reflecting areas and the transmitting areas alternate in an interleaving direction orthogonal to the first direction, and wherein a height of each transmitting area is greater than a height of reflecting areas arranged between the transmitting areas;
a mount to which the plurality of sources are mounted, wherein at least two sources have a first offset from one another in first direction, a second offset in the interleaving direction, and a third offset from one another in a lateral direction that is orthogonal to both the first direction and the interleaving direction, such that each of the at least two sources is arranged to emit a corresponding laser beam at a different position along the interleaving direction,
wherein each source includes a plurality of laser diodes, which are displaced from one another along the interleaving direction, the plurality of laser diodes for each source being arranged on a different heat sink.

14. The system of claim 13 wherein the transmitting and reflecting areas are configured to transmit or reflect laser beams with an elongated beam profile.

15. The system of claim 13 wherein the laser mirror is a metal mirror.

16. The system of claim 13 wherein the laser mirror includes a substrate.

17. The system of claim 16 wherein the laser mirror includes a high reflectivity coating on the substrate to form the reflecting areas.

18. The system of claim 16 wherein at least one of the two transmitting areas is a through hole through the substrate.

19. The system of claim 16 wherein the laser mirror includes an anti-reflection coating on the substrate to form at least one of the transmitting areas.

20. The system of claim 13 wherein the laser mirror has a ladder-like structure, wherein rungs of the ladder-like structure correspond to the reflection areas and the space between the rungs corresponds to the transmitting areas.

21. A method comprising:
  in an interleaving direction, interleaving multiple sets of laser beams, each set of laser beams being emitted along a first direction, orthogonal to the interleaving direction, from a source of a group of sources, thereby generating an interleaved beam,
  wherein neighboring laser beams within the beam correspond to different sources of the group of sources, each source including several laser diodes displaced along the interleaving direction, and at least two sources in the group of sources being offset from one another in the interleaving direction, offset from one another in a lateral direction that is orthogonal to both the interleaving direction and the first direction, and offset from one another in the first direction.

22. The method of claim 21 further comprising:
pumping a laser medium with the interleaved pump beam.

23. A laser system comprising:
  a first source and a second source for generating, along a first direction, a first laser beam and a second laser beam, respectively; and
  a mirror arrangement including a first interleaving laser mirror with a high reflecting area configured to reflect the first laser beam and a first high transmitting area configured to transmit the second laser beam; and
  a mount, wherein the first and second source are mounted to the mount with a first offset in an interleaving direction orthogonal to the first direction and a second offset from one another in a lateral direction that is orthogonal to both the first direction and the interleaving direction, such that the first source and second source are positioned to emit the first laser beam and the second laser beam at different positions along the interleaving direction, and
  wherein the first and a second sources each include several laser diodes, which are displaced from one another along the interleaving direction, the laser diodes of the first source being arranged on a first heat sink, and the laser diodes of the second source being arranged on a second different heat sink, and wherein each laser diode comprises a plurality of neighboring emitting regions.

* * * * *